United States Patent [19]
Uemura et al.

[11] Patent Number: 6,103,543
[45] Date of Patent: Aug. 15, 2000

[54] FABRICATION OF DEVICE ELECTRODES IN GAN AND RELATED MATERIALS

[75] Inventors: Toshiya Uemura; Naoki Shibata, both of Aichi, Japan

[73] Assignee: Toyoda Gosei Co., Ltd., Aichi, Japan

[21] Appl. No.: 08/942,595

[22] Filed: Oct. 2, 1997

[30] Foreign Application Priority Data

Oct. 3, 1996 [JP] Japan ................................. 8-283278

[51] Int. Cl.⁷ .................................................. H01L 21/20
[52] U.S. Cl. ............................ 438/46; 438/507; 438/718
[58] Field of Search ................... 438/22, 39, 40, 438/46, 507, 718, 932

[56] References Cited

U.S. PATENT DOCUMENTS 5,272,108 12/1993 Kozawa .

FOREIGN PATENT DOCUMENTS

| 0 579 897 | 1/1994 | European Pat. Off. . |
| 0 622 858 | 11/1994 | European Pat. Off. . |
| 0 650 201 | 4/1995 | European Pat. Off. . |
| 42 05 584 | 9/1992 | Germany . |

OTHER PUBLICATIONS

Patent Abstracts of Japan, vol. 015, No. 304 (E–1096) Aug. 1991 re JP–A 03–108779.

Patent Abstracts of Japan, vol. 016, No. 196 (E–1200) May 1992 re JP–A 04–029378.

Z. Fan et al., "Very Low Resistance Multilayer Ohmic Contact to n–GaN," Applied Physics Letters, vol. 68, No. 12, Mar. 18, 1996, pp. 1672–1674.

M.E. Lin et al., "Low Resistance Ohmic Contacts on Wide Band–Gap GaN," Applied Physics Letters, vol. 64, No. 8, Feb. 21, 1994, pp. 1003–1005.

*Primary Examiner*—Charles Bowers
*Assistant Examiner*—Keith Christianson
*Attorney, Agent, or Firm*—Pillsbury Madison & Sutro LLP

[57] ABSTRACT

A base layer of electode made of at least a metal selected from V, Nb, and Zr, or an alloy containing such metal on an n-type GaN compound semiconductor layer. Further, a main electrode layer made of other metal is formed on the base layer. Then, an n electrode is formed by subjecting the semiconductor layer, the base layer, and the main electrode layer to a heat treatment.

9 Claims, 14 Drawing Sheets

FIG. 4

| RIE HISTORY | NO AFTER TREATMENT | AFTER TREATMENT 5 min. | AFTER TREATMENT 5 min. |
|---|---|---|---|
| ALLOYING CONDITION | 600°C 0 min. | 550°C 3 min. | 500°C 10 min. |
| ELECTRODE (BASE LAYER/ MAIN ELECTRODE) | VOLTAGE (V AT 20mA) BEFORE ALLOYING → AFTER ALLOYING | VOLTAGE (V AT 20mA) BEFORE ALLOYING → AFTER ALLOYING | VOLTAGE (V AT 20mA) BEFORE ALLOYING → AFTER ALLOYING |
| /Al | 1.6 (S) → 1.6 (S) | | |
| Nb/Al | 1.15 (S) → 0.60 (O)<br>→ 0.68 (O)<br>→ 0.75 (O) | 1.95 (S) → 0.51 (O)<br>→ 0.47 (O)<br>→ 0.54 (O) | 1.8 (S) → 1.0 (OS)<br>→ 1.05 (S)<br>→ 0.63 (O) |
| Cr/Al | 1.15 (S) → 0.85 (S) | | |
| Zr/Al | 1.4 (S) → 0.63 (OS) | | |
| V/Al | 0.8 (S) → 0.43 (O)<br>→ 0.52 (O)<br>→ 0.56 (O) | 1.45 (S) → 0.51 (O)<br>→ 0.51 (O)<br>→ 0.50 (O) | 1.65 (S) → 0.80 (O)<br>→ 0.75 (O)<br>→ 0.92 (O) |

BASE LAYER/MAIN ELECTRODE: 200Å / 5000Å
(O) : OHMIC CONTACT
(S) : SCHOTTKY CONTACT
(OS): SUBSTANTIALLY OHMIC CONTACT

FIG. 5

| NO. | RIE HISTORY | ALLOYING CONDITION | VOLTAGE BEFORE ALLOYING | VOLTAGE AFTER ALLOYING |
|---|---|---|---|---|
| 1 | NO AFTER TREATMENT | 600°C 0 min. | 0.80 (S) | 0.50 (O) |
| 2 | AFTER TREATMENT 5 min. | 550°C 3 min. | 1.45 (S) | 0.51 (O) |
| 3 | AFTER TREATMENT 5 min. | 500°C 10 min. | 1.65 (S) | 0.82 (O) |
| 4 | AFTER TREATMENT 15 min. | 550°C 3 min. | 0.69 (S) | 0.56 (O) |

BASE LAYER/MAIN ELECTRODE: V (200Å) / Al (1.5 μm)
UNIT OF VOLTAGE: V AT 20mA
(O) : OHMIC CONTACT
(S) : SCHOTTKY CONTACT
(OS): SUBSTANTIALLY OHMIC CONTACT

FIG. 6

| n: ELECTRODE V (Å) / Al (μm) | BEFORE ALLOYING | AFTER ALLOYING | |
|---|---|---|---|
| | | ALLOYING CONDITION 550°C 3 min. | 550°C 3 min. |
| Al (1.5) | 0.85 (S) | 1.01 (S) | 1.07 (S) |
| V ( 50) / Al (1.5) | 0.72 (S) | 2.3 (S) | |
| V (100) / Al (1.5) | 0.72 (S) | 0.52 (O) | 0.48 (O) |
| V (150) / Al (1.5) | 0.72 (S) | 0.52 (O) | 0.48 (O) |
| V (200) / Al (1.5) | 0.69 (S) | 0.58 (O) | |
| V (250) / Al (1.5) | 0.62 (S) | 0.68 (O) | 0.90 (OS) |
| V (300) / Al (1.5) | 0.72 (S) | 0.60 (O) | 0.67 (O) |
| V (500) / Al (3.0) | 0.83 (S) | 0.60 (O) | 1.06 (OS) |

AFTER TREATMENT: 15min. TO ALL SAMPLES
(O) : OHMIC CONTACT
(S) : SCHOTTKY CONTACT
(OS): SUBSTANTIALLY OHMIC CONTACT 5mA/div.

0.2V/div.

5mA/div.

0.5V/div.

FABRICATION OF DEVICE ELECTRODES IN GAN AND RELATED MATERIALS

BACKGROUND OF THE INVENTION

1. Field of the Invention

The invention relates to a method of manufacturing a compound semiconductor device using GaN related materials. More particularly, the invention is directed to an improved connection of electrodes to an n-type semiconductor layer in the device. The compound semiconductor device using GaN related materials includes, e.g., light-emitting diodes and laser diodes.

2. Description of the Related Art

The compound semiconductors such as GaN related materials, being of a direct transition type, exhibit high light-emitting efficiency and emit blue light, which is one of the three primary colors of light. Therefore, the compound semiconductors such as GaN related materials attract attention as a light-emitting device forming material in recent years.

In such the compound semiconductor device such as a GaN related meterials, a material for n electrode that is connected to an n-type semiconductor layer generally requires a low work function. Aluminum (Al) has exclusively been used as the n electrode forming material.

The n-type semiconductor layer in a light-emitting diode using GaN related materials generally becomes a first clad layer, on which a light-emitting layer and a p-type semiconductor layer serving as a second clad layer are sequentially grown. Then, some part of the p-type semiconductor layer, the light-emitting layer, and the n-type semiconductor layer is introduced to a reactive ion etching process using a gas or the mixing gas with at least a gas containing either chloride or fluorine atom to thereby form a forming portion for electrode on the n-type semiconductor layer.

Since it is assumed that the surface of n-type layer which is etched by RIE process is deposited by remnants such as chlorides and oxides which are formed at the etching process, the portion for electrode has been further introduced to a sputtering process (hereinafter referred to as the "after treatment") using an inert gas such as argon as disclosed in Japanese Patent Publication No. Hei. 3-108779.

An n electrode is formed by depositing Al onto the thus after-treated electrode forming portion.

The inventors have studied the thus formed element. As a result, the inventors have found that such element addresses the following problems to be overcome.

If the after treatment is omitted, it is difficult to obtain good ohmic contacts between the semiconductor layers and the n electrode. However, even if an after treatment is carried out, the ohmic contacts are hard to stabilize. That is, the resistance between the semiconductor layers and the n electrode fluctuates. The reason therefor is assumed to be that remnants deposited the portion for electrode are hard to remove completely even if an after treatment is carried out.

If an after treatment is to be carried out, a step must be added to in the manufacturing process. In order to remove the remnants deposited on the portion for electrode completely, a complicated after treatment must be carried out.

SUMMARY OF THE INVENTION

The invention has been made to overcome the aforementioned problems.

According to the present invention, there is provided a method of manufacturing a compound semiconductor device using GaN related materials: forming a semiconductor layer made of an n-type GaN compound semiconductor; forming a base layer of electrode on a portion of the semiconductor layer, the base layer being made of at least one metal selected from V, Nb, and Zr; forming a main electrode layer on the base layer, the main electrode layer being made of other metal; and heating the semiconductor layer, the base layer, and the main electrode layer.

The thus obtained semiconductor device includes: a semiconductor layer made of an n-type GaN compound semiconductor; and an electrode arranged on the semiconductor layer and made of at least one metal selected from V, Nb, and Zr.

BRIEF DESCRIPTION OF THE DRAWINGS

In the accompanying drawings:

FIG. 4 is table showing the experimental results of the invention in the various case;

FIG. 5 is a table showing the experimental results of the invention;

FIG. 6 is a table showing the experimental results of the invention in the various alloying conditions and V thickness;

FIG. 10(a) is a graph showing voltage-current characteristics and FIG. 10(b) is a microscopic photograph of an n electrode;

FIG. 12(a) is a graph showing voltage-current characteristics and FIG. 12(b) is a microscopic photograph of an n electrode;

FIG. 13(a) is a graph showing voltage-current characteristics and FIG. 13(b) is a microscopic photograph of an n electrode;

FIG. 15(a) is a graph showing voltagecurrent characteristics and FIG. 15(b) is a microscopic photograph of an n electrode.

DETAILED DESCRIPTION OF THE CURRENTLY PREFERRED EMBODIMENTS

The invention will now be described in more detail.

FIGS. 1(a) to 1(e) are schematic diagrams illustrative of a method of manufacturing a compound semiconductor device using GaN related materials of the invention.

Figure 1A:
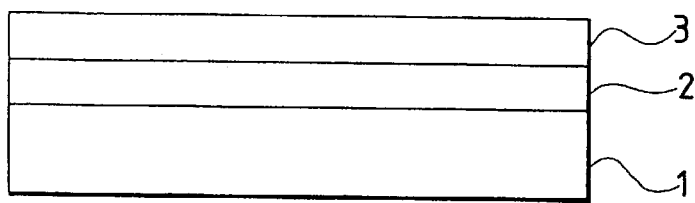
FIGS. 1(a) to 1(e) are sectional views illustrative of a manufacturing method of the invention.

As shown in FIG. 1(a), an n-type semiconductor layer (hereinafter referred to as the "n layer") 2 is formed on a substrate 1, the n-layer being made of a GaN compound semiconductor. In order to form a device, a p-type semiconductor layer (hereinafter referred to as the "p layer") 3 is formed on the n layer 2. While it is desirable that the p layer 3 be formed of the GaN compound semiconductor from the viewpoint of lattice matching with the n layer, the p layer 3 may be formed of other materials as long as an device can be formed. The way in which the n layer 2 and the p layer 3 are formed is not particularly limited.

Figure 2:
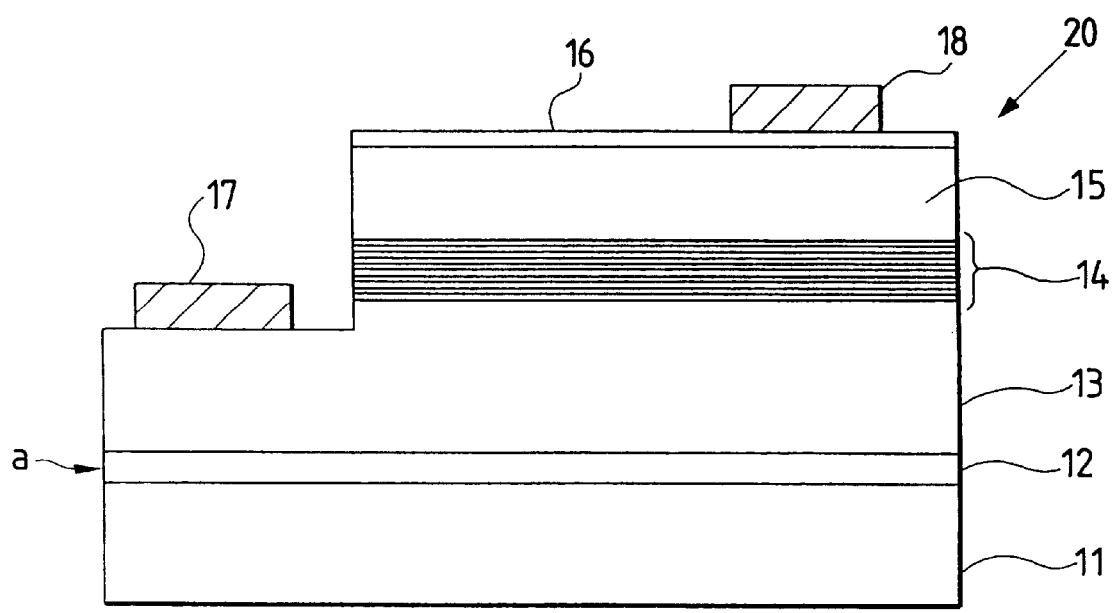
FIG. 2 is a sectional view of a light-emitting diode, which is an embodiment of the invention.

If a light-emitting diode is to be manufactured, the steps shown in FIG. 1(a) will be as follows. That is, as shown in FIG. 2, an n-type semiconductor layer 13 made of $Al_XIn_YGa_{1-X-Y}N$ (including X=0, X=Y, X=Y=0) is formed on a sapphire substrate with a plane 11 through an amorphous buffer layer 12 made of $Al_XGa_{1-X}N$. Then, a layer for light-emitting 14 having a multi quantumwell (MQW) structure and a p-type semiconductor layer 15 made of $Al_AIn_BGa_{1-A-B}N$ (including A=0, A=B, A=B=0) are sequentially formed on the semiconductor layer 13. These semiconductor layers are formed in accordance with an ordinary method based on a metal organic vapor phase epitaxial growth method (hereinafter referred to as the "MOVPE method").

The n-type semiconductor layer 13 can be formed into a two-layered structure with a low electron density on the light-emitting layer side and a high electron density on the buffer layer side.

The light-emitting layer 14 is not limited to that having such a MQW structure shown in FIG. 2, but may have a single heterostructure, a double heterostructure, and the like.

An $Al_XIn_YGa_{1-X-Y}N$ (including X=0, X=Y, X=Y=0) layer that has a wider band gap than the p-type second semiconductor layer 15 doped with an acceptor such as magnesium can be interposed between the light-emitting layer 14 and the p-type second semiconductor layer 15. This is to prevent electrons introduced into the light-emitting layer 14 from being diffused into the p-type semiconductor layer 15.

The p-type semiconductor layer 15 can be formed into a two-layered structure with a low hole density on the light-emitting layer side and a high hole density on the electrode side.

A so-called MIS (metal-insulator semiconductor) type light-emitting element can be formed by stacking an i-type semi-insulator layer on the n-type semiconductor layer.

Figure 1B:
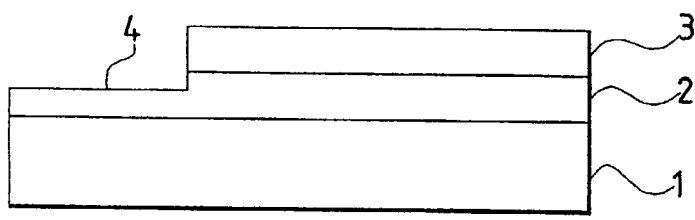

In the step shown in FIG. 1(b), the p layer 3 and the part of the n layer 2 is removed by dry etching, so that a surface 4 for forming an n electrode is formed. The surface 4 can be obtained if at least the p layer 3 is removed from the upper surface of the n layer 2.

The aforementioned dry etching process is a reactive ion etching process carried out by using a gas or the mixing gas of a gas containing chlorine and/or fluorine atom such as dichlorodifluoromethane ($CCl_2F_2$), tetrachloromethane ($CCl_4$), tetrafluoromethane ($CF_4$), $BCl_3$ or the like.

In addition, a dry etching (sputter etching) process is thereafter carried out as an after treatment using an inert gas such as argon. This after treatment can be omitted.

The after treatment has heretofore been requisite before forming the n electrode (see the aforementioned Japanese Patent Publication No. Hei. 3-108779). However, according to the invention, an ohmic contact was obtained between the n electrode and the n-type semiconductor layer 2 even if no after treatment was carried out. The details will be described later.

The electrode forming surface can be obtained also by limiting in the n layer 2 a surface on which to grow the p layer 3. For example, at the time of growing the p layer 3, the electrode forming surface on the n layer 2 is covered with a mask, and the mask is thereafter removed.

However, even in this case, the mask on the n layer 2 cannot be removed completely (to the atomic level of the surface). Therefore, it is difficult to obtain the ohmic contact even if Al is simply deposited on the thus processed n layer 2.

Figure 1C:
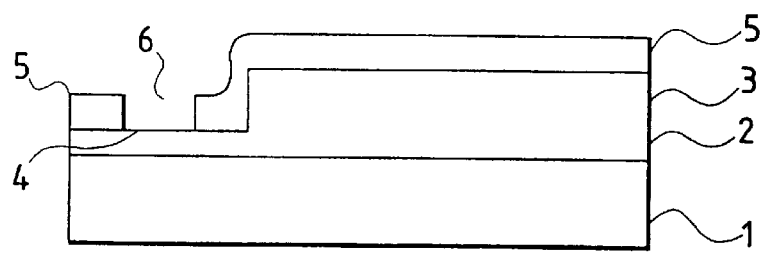

In the step shown in FIG. 1(c), a photoresist 5 is patterned on both the p layer 3 and the surface 4, so that a window 6 is formed in the n electrode forming portion.

A general-purpose photosensitive resin is used as the photoresist. It is preferred that the thickness of the photoresist be thicker than that of the n electrode; i.e., the preferable thicknesses range from 0.3 to 5 μm.

Figure 1D:
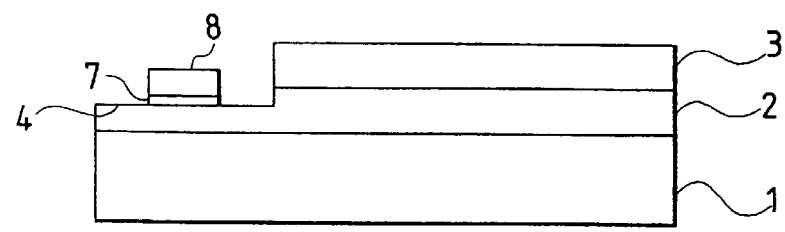

A base layer 7 forming material and a main electrode layer 8 forming material are thereafter deposited over the entire surface of the resist 5 and the window 6, and the resist 5 is removed by the so-called lift-off technique, so that the structure shown in FIG. 1(d) is obtained.

Here, it is preferred that the material for the base layer 7 is a metal selected from Nb (niobium), Zr (zirconium), and V (vanadium) as shown in the table of FIG. 4. It is assumed that an alloy containing these metals may similarly be applied.

When the base layer was made of V in particular, the ohmic contact was obtained between the n electrode and the n layer, not only whether the after treatment is carried out or not, but also under a wide range of heating conditions for alloying. In other words, by using V for the base layer, conditions required for forming the n electrode to the n layer are eased, which in turn contributes to facilitating the forming operation.

It is preferred that the main electrode 8 forming material be a single metal selected from the group consisting of Al, Ti, Zn, Ta, and Ni. These metals have small work function with respect to the n layer, and have satisfactory compatibility with the n layer as an electrode. An alloy containing these metals may also be used as the main electrode layer 8 forming material.

Figure 1E:
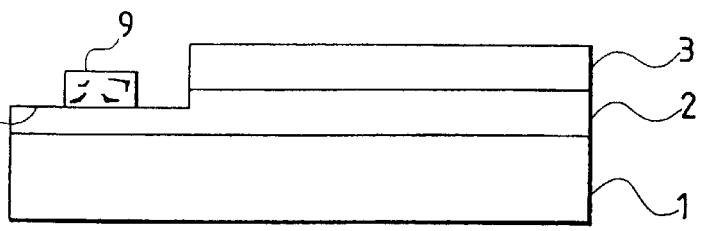
Figure 3:
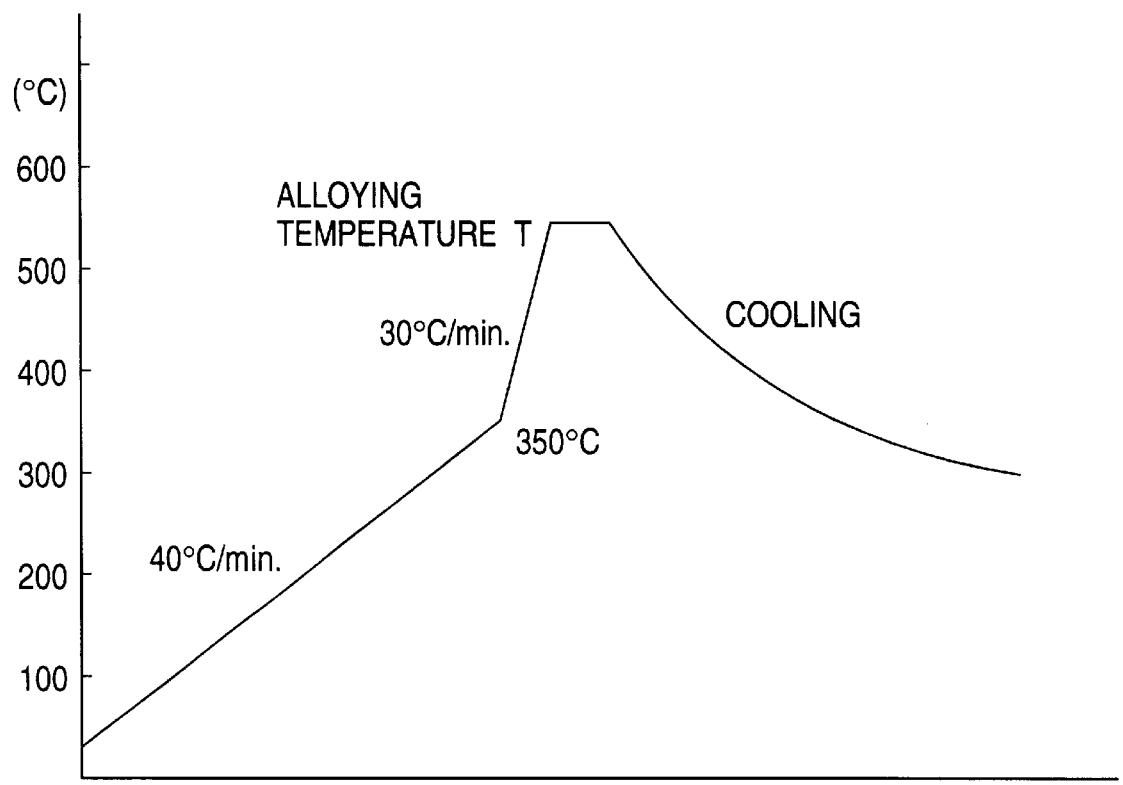
FIG. 3 is a example of a heat treatment according to the manufacturing method of the invention.

In the step shown in FIG. 1(e), at least the n layer 2, the base layer 7, and the main electrode layer 8 are subjected to a heat treatment under the conditions shown in FIG. 3. A p electrode (not shown) of the p layer may, of course, can be heat-treated simultaneously therewith. As a result, the base layer 7 and the main electrode layer 8 are alloyed to be an n electrode 9.

It may be noted that this n electrode can be covered the upper surface and/or the side surfaces by other conductive metal.

The heat treatment shown in FIG. 3 will be described. First, the temperature of the sample is increased by 40° C. per minute in the atmosphere. When the temperature of the sample exceeds 350° C., the temperature of the sample is rapidly increased by 300° C. per minute up to an alloying temperature indicated as alloying conditions in the tables of FIGS. 4 to 6. Then, such alloying temperature is maintained for a corresponding time indicated in the same tables. The sample is thereafter cooled.

It may be noted that heat treatment ambient is not particularly limited. That is, the heat treatment can be carried out not only under atmospheric pressure, but also under vacuum, while low pressure, and while high pressure. Further, the heat treatment can also be carried out while introducing an appropriate amount of $N_2$, Ar, $O_2$, $H_2$, and the like.

Hereupon, the temperature increase rates of 40° C./min and 300° C./min are so set as to prevent wafers from cracking and electrodes from being separated. Therefore, these rates will not affect the properties of wafers to be obtained after alloying.

It is preferred that the alloying temperature be set to 450 to 700° C., or more preferably, to 500 to 600° C. If the alloying temperature is less than 450° C., it is difficult to provide a good ohmic contact between the n electrode and the n layer. Further, if the alloying temperature exceeds 700° C., there is a danger that the semiconductor layers will be adversely affected. In the case of a light-emitting diode having a MQW structured light-emitting layer in particular, there is a danger of losing structural change not only in MQW layers but also between the quantum well layer and the barrier layer.

The remnants (oxides, chlorides, organic substances, and the like) generated at the etching process and the remnants from resist that are assumed to coat the surface 4 on the bottom surface of the window 6 as a result of the aforementioned heat treatment are absorbed by the base layer 7. Further, it is assumed that forming material with the base layer 7 is entrapped into the main electrode layer 8 forming material together with the remnants. As a result, the main electrode layer 8 forming material that is originally compatible with the n layer 2 is contacted to the semiconductor layer 2.

Samples used in an experimental example to be described below are prepared in the following way.

Figure 7A:
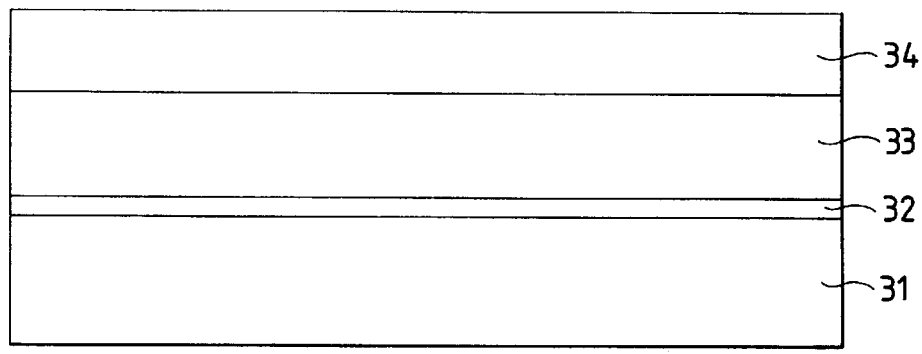
FIG. 7(a) is a sectional view of a bare wafer.

As shown in FIG. 7(a), a 4 µm-thick n layer 33 made of silicon-doped GaN is formed on a sapphire substrate 31 through a 160 Å-thick buffer layer 32 made of AlN. The carrier density of the n layer 33 is $2\times10^{18}/cm^3$. Then, a p layer 34 made of magnesium-doped GaN is formed on the n layer 33. The respective semiconductor layers are formed by the MOVPE method.

Electron beams are thereafter irradiated so that the magnesium-doped GaN layer is activated to be a p-type layer.

Figure 7B:
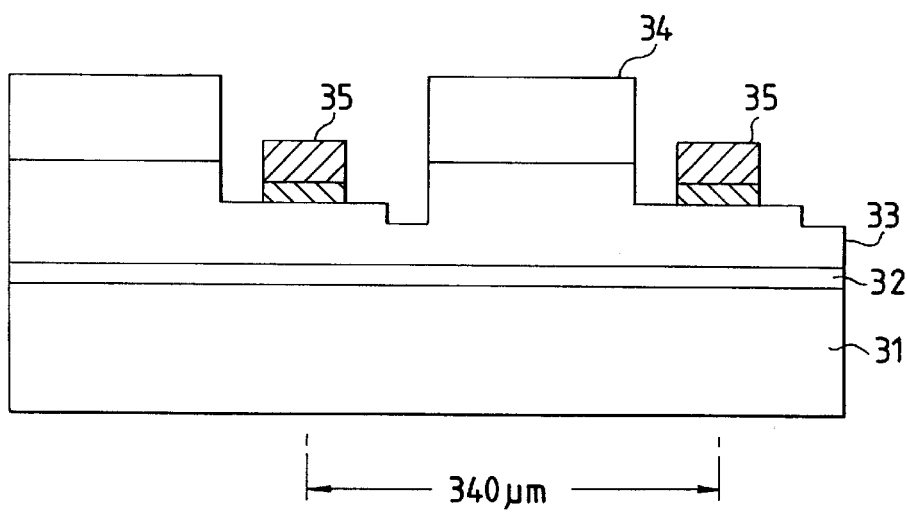
FIG. 7(b) is a sectional view.
Figure 7C:
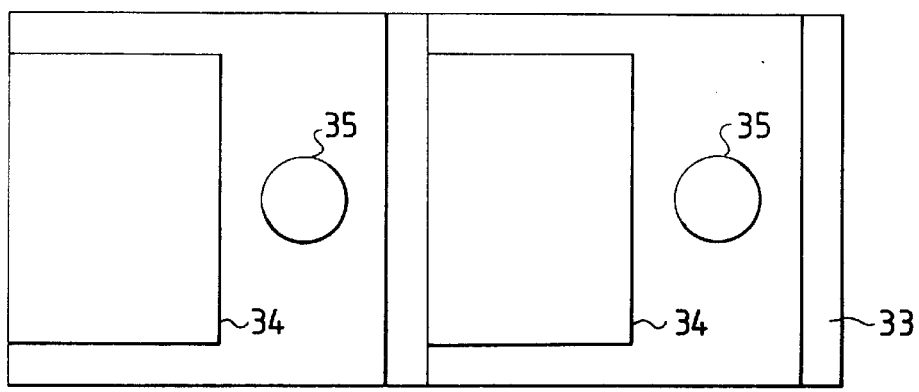
FIG. 7(c) is a plan view of LED sample.

A semiconductor layer design shown in FIGS. 7(b) and 7(c) is thereafter obtained by a reactive ion etching process using $BCl_3$ gas. Such etching process is carried out at a RF power of 150W and at a pressure of 1.5 Pa for 180 minutes.

Further, the etched surface is subjected to a sputter etching process using argon gas as an after treatment after the reactive ion etching process has been completed. The sputter etching process was carried out at a RF power of 150W and at a pressure of 8 Pa for 10 minutes.

Then, n electrodes 35 are formed under the conditions shown in the respective tables. The distance between the n electrode 35 and the n electrode 35 is 340 µm. The diameter of the n electrode 35 is 110 µm.

The voltages indicated in the tables of FIGS. 4 to 6 are those between the n electrode 35 and the n electrode 35 when a current of 20 mA is flowed between the n electrodes 35.

By the term "before alloying", it is intended to mean a sample that has not yet been subjected to the heat treatment shown in FIG. 3, and by the term "after alloying", it is intended to mean a sample that has been subjected to the same heat treatment.

The ohmic contact indicated by (O) in the tables is judged to be present when current-voltage characteristics are linear.

The ohmic contact indicated by (OS) in the tables is judged to be substantially present when current-voltage characteristics are substantially linear.

The schottky contact indicated by (S) in the tables is judged to be present when current-voltage characteristics are not linear.

It is understood from the table shown in FIG. 4 that the ohmic contacts can be substantially obtained between the n electrodes 35 and the n layer 33 whether the after treatment by the sputter etching process using an inert gas, such as argon, is carried out or not, if the base layer is made of Nb, Zr, or V.

That is, if the base layer is formed of V, the ohmic contacts were totally obtained between the n electrodes 35 and the n layer 33 after the alloying process.

If the base layer is formed of Nb Or Zr, an operation voltage drop is observed after the alloying process. On the other hand, if there is no base layer and the n electrodes are made only of Al, no voltage drop is observed. Further, if the base layer is formed of Nb, there are cases where the ohmic contacts are obtained and where no ohmic contacts are obtained after the alloying process.

It is assumed from the foregoing that the ohmic contacts can be obtained by optimizing the heat treatment conditions, even if the base layers are formed of Zr.

When the base layer made of Nb is alloyed at temperatures over 550° C., the ohmic contacts can be obtained between the n electrodes 35 and the n layer 33 reliably. When the alloying temperature is set to 530° C. or more, it is assumed that the ohmic contacts can be substantially obtained between both layers.

In the case of the base layer made of V, the ohmic contacts are obtained between the n electrodes 35 and the n layer 33 under a wider range of conditions. If the base layer is alloyed at a temperature of 550° C. for 3 minutes, substantially the same voltage is obtained by three samples, which indicates that stable ohmic contacts can be obtained.

The table shown in FIG. 5 confirms that the ohmic contacts between the n electrodes 35 and the n layer 33 are not affected by the after treatment in the case of the base layer made of V.

It is assumed that similar behavior is exhibited in the cases of the base layers made of Nb and Zr.

The table shown in FIG. 6 examines the thickness of the base layer made of V. As is understood from this table that the thickness of the base layer is preferably set to 75 to 1000 Å, or more preferably to 100 to 500 Å. If the thickness of the base layer is less than 75 Å, there is a possibility that the remnants not reacting with the base layer remain on the surface of the electrode forming portion. However, if the amount of impurities on the n layer is small, it is assumed that the thickness of the base layer that is less than 75 Å could provide satisfactory properties. If the thickness exceeds 1000 Å, there is a danger that the base layer remains between the main electrode layer and the n layer even after the after treatment has been carried out.

In the cases where the base layers are formed of Nb, Cr, and Zr, it is assumed that thicknesses similar to that of the base layer made of V can be applied.

Figure 8:
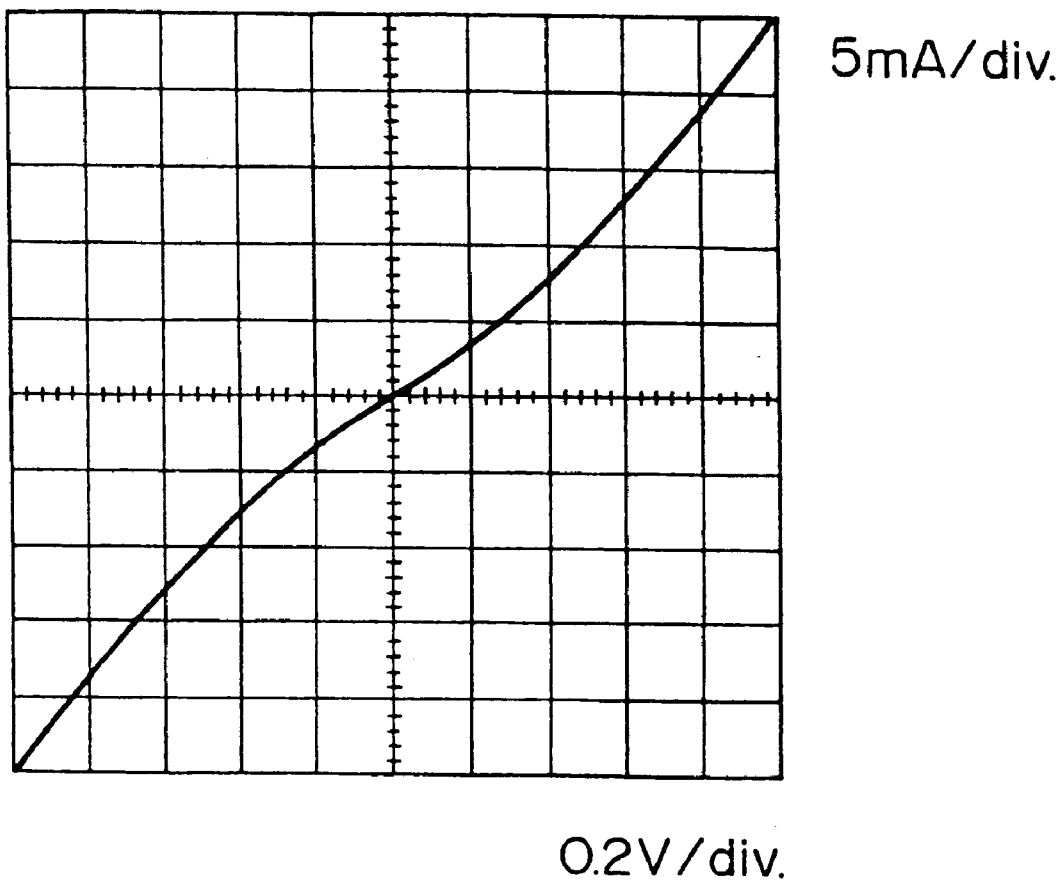
FIG. 8 is a graph showing the voltage-current characteristics of the sample which has n-electode formed only of Al without heat treatment.

FIG. 8 shows voltage-current characteristics between the n electrode 35 and the n electrode 35 in a sample before alloying, i.e., having no heat treatment when the n electrode 35 (thickness is 1.5 μm) is formed of a single aluminum body using no base layer. It may be noted that the sample is subjected to an after treatment (sputter etching using argon gas) for 5 minutes.

Figure 9A:
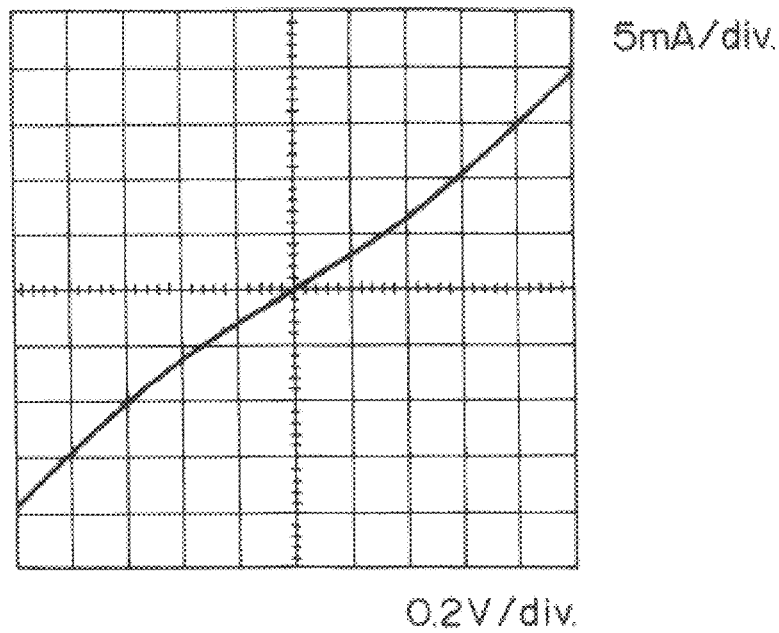
FIGS. 9(a) is a graph showing the voltage-current characteristics of the sample same to FIG. 8 with heat treatment (550° C., 3 min), and FIG.(b) is a microscopic photograph of an n-electrode surface.
Figure 9B:
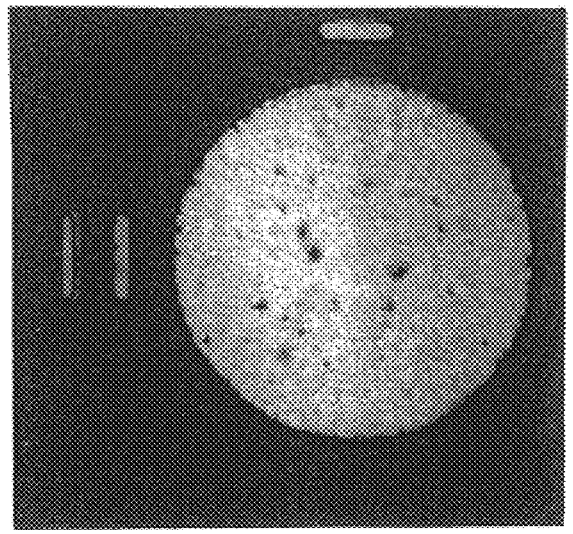

FIG. 9(a) shows the voltage-current characteristics of the same when the sample from which measurements were made in FIG. 8 is subjected to a heat treatment (under an alloying temperature of 550° C. for 3 minutes) in accordance with the history shown in FIG. 3. Further, FIG. 9(b) is a microscopic photograph of the surface of the thus heat-treated n electrode.

Figure 10A:
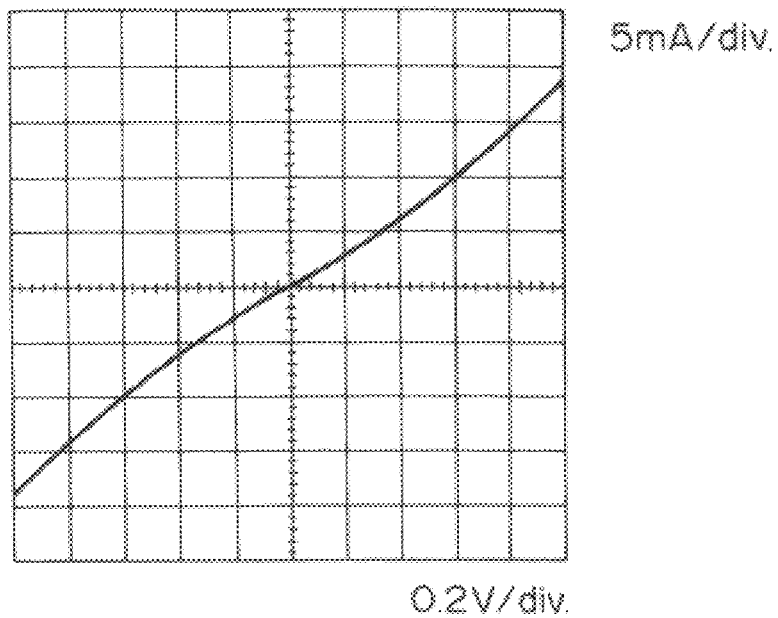
FIGS. 10(a) and 10(b) show diagrams showing characteristics after the same comparative example is subjected to a heat treatment (at an alloying temperature of 550° C. for 0.5 minute)
Figure 10B:
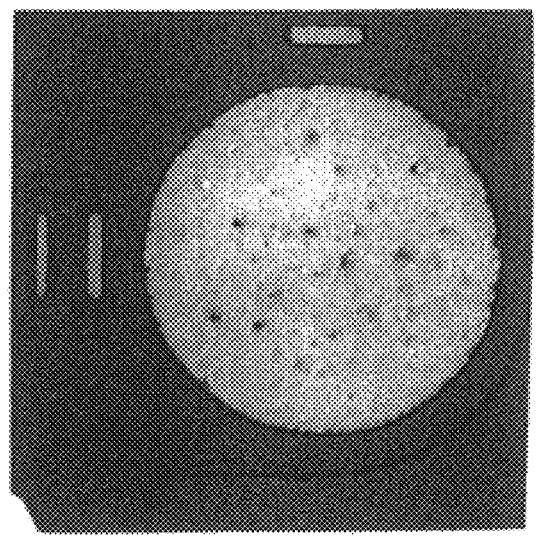

Similarly, FIG. 10(a) shows voltage-current characteristics when the same sample is subjected to a heat treatment (under an alloying temperature of 550° C. for 0.5 minute), and FIG. 10(b) is a microscopic photograph of the surface of the thus heat-treated n electrode.

It is understood from FIGS. 8 to 10 that a Schottky contact is obtained between the n electrode 35 and the n layer 33 even if the sample is heat-treated when the electrode 35 is formed of a single aluminum body, which indicates that the surface of the n electrode 35 is rough.

Figure 11:
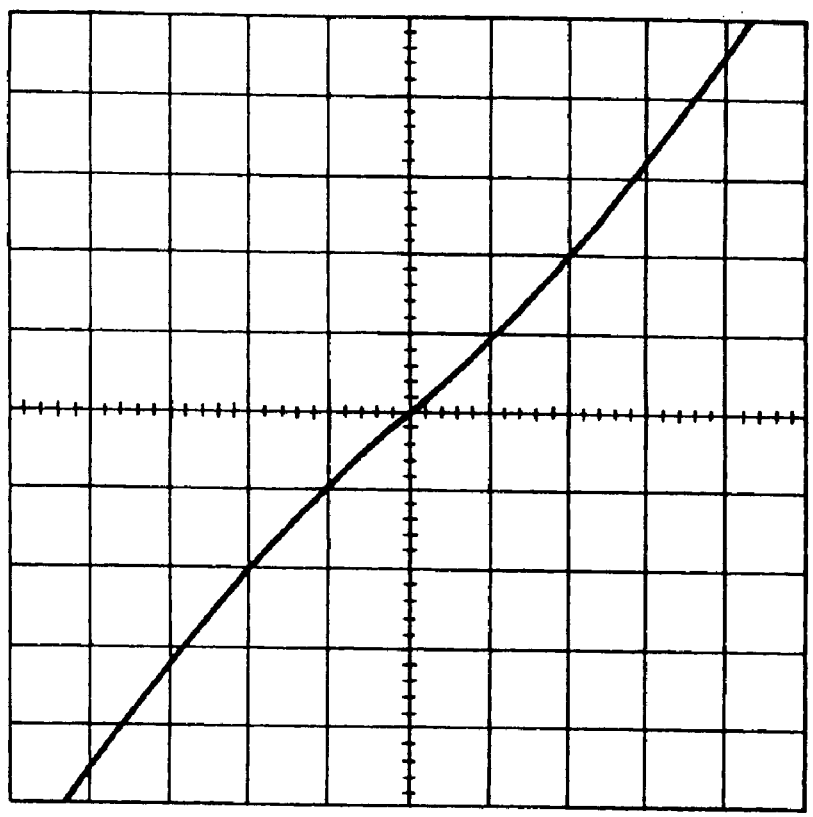
FIG. 11 is a graph showing the voltage-current characteristics of an experimental example (in the case where an n electrode is formed (the base layer is made of V (150 Å); the main electrode layer is made of Al (1.5 $\mu$m); an after treatment is carried out) before a heat treatment).

FIG. 11 shows voltage-current characteristics between the n electrode 35 and the n electrode 35 before alloying when the base layer is formed of V (thickness is 150 Å) and the main electrode layer thereon is formed of Al (thickness is 1.5 μm). It may be noted that an after treatment is carried out for 5 minutes.

Figure 12A:
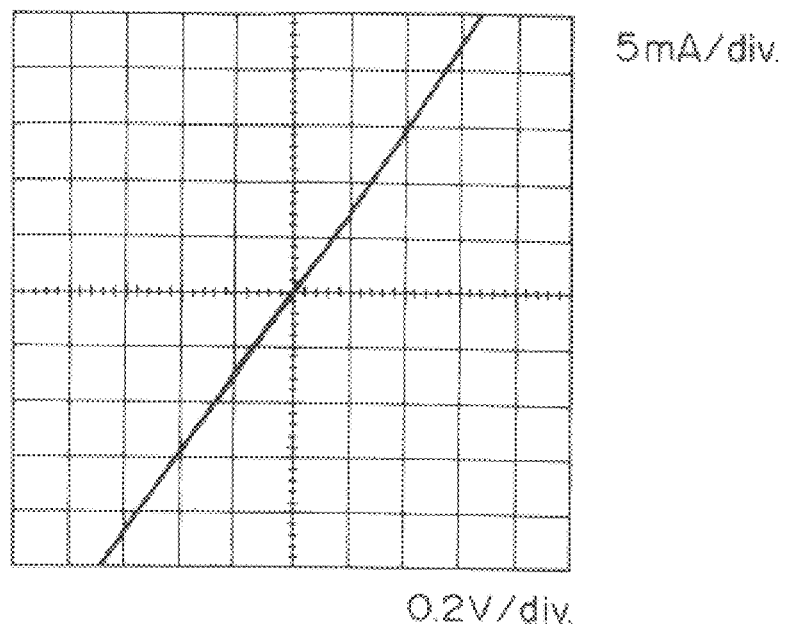
FIGS. 12(a) and 12(b) show diagrams showing characteristics after the same experimental example is subjected to a heat treatment (at an alloying temperature of 550° C. for 3 minutes)
Figure 12B:
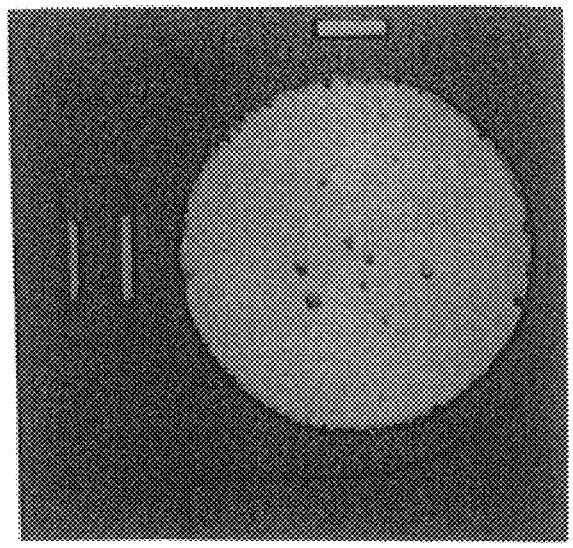

FIG. 12(a) shows the voltage-current characteristics of the same when the sample from which measurements were made in FIG. 11 is subjected to a heat treatment (under an alloying temperature of 550° C. for 3 minutes) in accordance with the history shown in FIG. 3. Further, FIG. 12(b) is a microscopic photograph of the surface of the thus heat-treated n electrode.

Figure 13A:
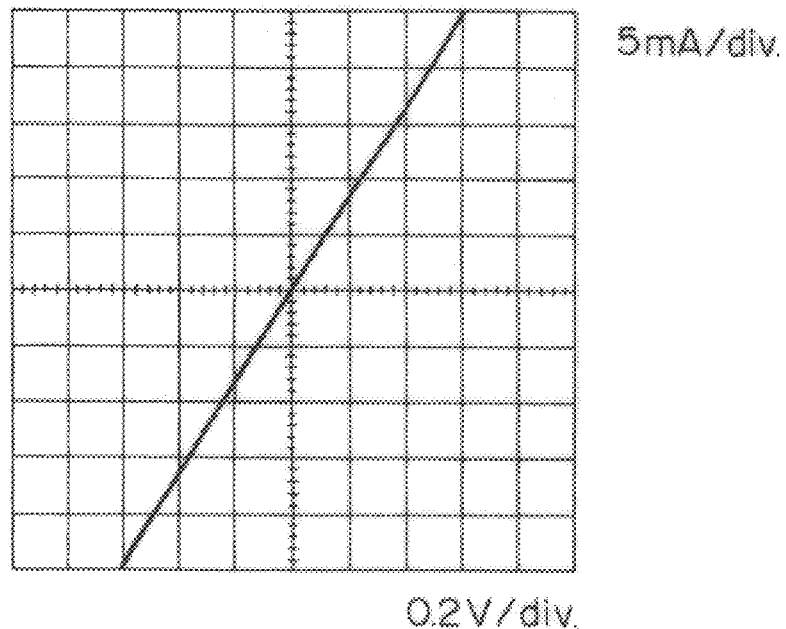
FIGS. 13(a) and 13(b) show diagrams showing characteristics after the same experimental example is subjected to a heat treatment (at an alloying temperature of 550° C. for 0.5 minute)
Figure 13B:
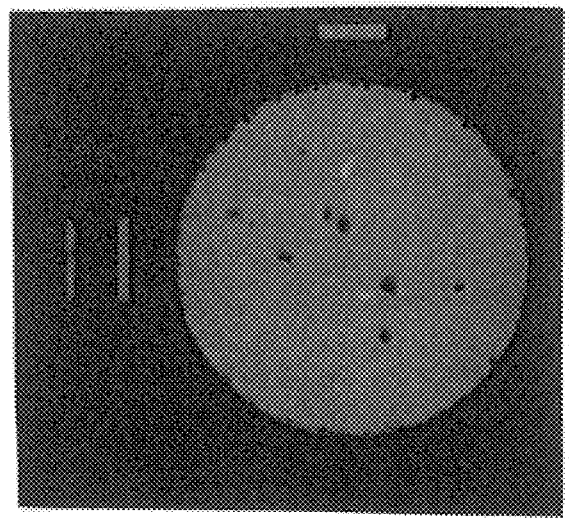

Similarly, FIG. 13(a) shows the voltage-current characteristics of the same when the sample is subjected to a heat treatment (under an alloying temperature of 550° C. for 0.5 minute), and FIG. 13(b) is a microscopic photograph of the surface of the thus heat-treated n electrode.

It is understood from FIGS. 11 to 13 that the perfect ohmic contacts are obtained between the heat-treated n electrodes 35 and the n layer 33 by using the base layer made of V. Further, the surface of the n electrode 35 has a good morphology. When the surface of the n electrode 35 has a good morphology, the wire bonding operation to the n electrode 35 can be facilitated, which in turn makes the wires hard to come off after wire-bonded. Further, if sample image data is gathered and such image data is processed during the wire bonding operation, the location of the center of an electrode to be wire-bonded can be specified. Here, if the surface of the electrode free from stains and rough is obtained, the reliability of the location of an electrode specified by the image processing can be improved. Hence, the yield of the wire boding operation can be improved.

Figure 14:
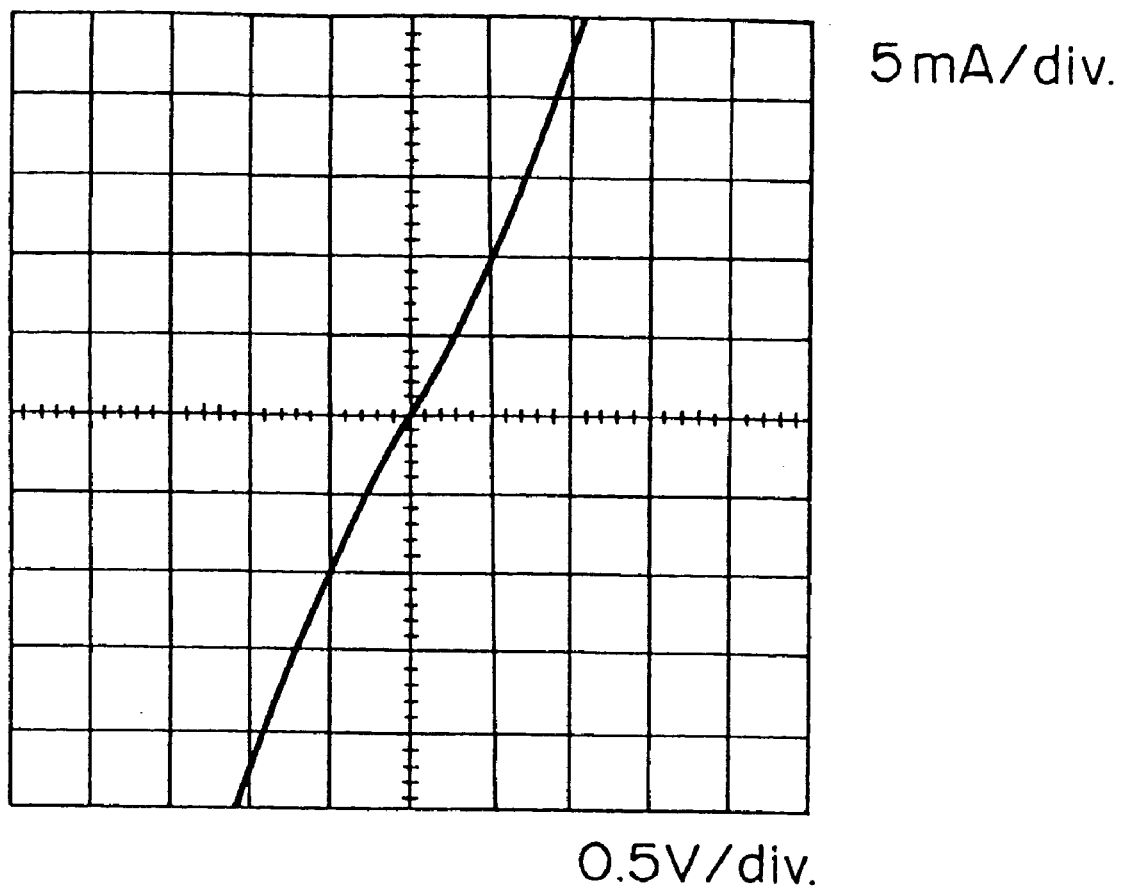
FIG. 14 is a graph showing the voltage-current characteristics of an experimental example (in the case where an n electrode is formed (the base layer is made of V (150 Å); the main electrode layer is made of Al (5000 Å); and an after treatment is carried out) before a heat treatment)

FIG. 14 shows voltage-current characteristics between the n electrode 35 and the n electrode 35 before alloying when the base layer is formed of V (thickness is 200 Å) and the main electrode layer thereon is formed of Al (thickness is 5000 Å). It may be noted that no after treatment is carried out.

Figure 15A:
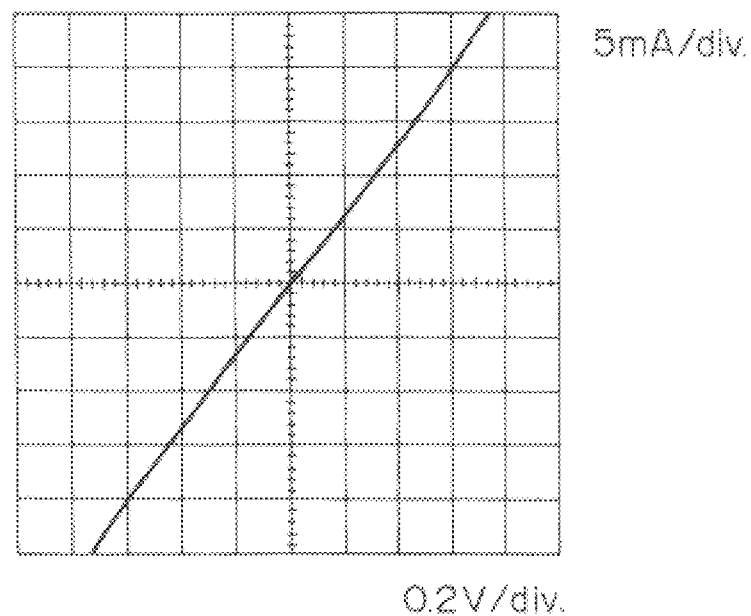
FIGS. 15(a) and 15(b) show diagrams showing characteristics after the same experimental example is subjected to a heat treatment (at an alloying temperature of 600° C. for 0 minute)
Figure 15B:
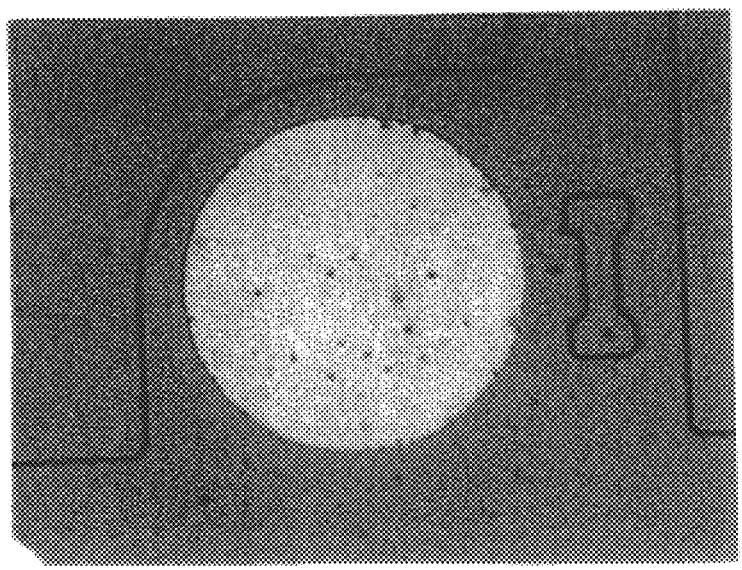

FIG. 15(a) shows the voltage-current characteristics of the same when the sample from which measurements were made in FIG. 14 is subjected to a heat treatment (under an alloying temperature of 600° C. for 0 minute) in accordance with the history shown in FIG. 3. Further, FIG. 15(b) is a microscopic photograph of the surface of the thus heat-treated n electrode.

It is understood from FIGS. 14 and 15 that the perfect ohmic contact is obtained between the n electrode 35 and the n layer 33 by using the base layer made of V whether the heat treatment is carried out or not. Further, the surface of the n electrode 35 has a good morphology.

A light-emitting diode, which is an embodiment of the invention, will be described with reference to FIG. 2.

Semiconductor layers 12 to 15 on a substrate 11 are grown by the MOVPE method. This growing method is designed to grow desired crystals on a substrate by supplying ammonia and alkyl compound gases containing group III elements such as trimethylgallium (TMG), trimethylaluminum (TMA), or trymethylindium (TMI) to the substrate that has been heated to an appropriate temperature and by subjecting the substrate to a thermal decomposition process. Since the semiconductor layer forming method based on the MOVPE method is known, specific conditions of the method will not be described. For details, see Japanese Patent Publication Nos. Hei. 5-175124, Hei. 8-97471, Hei. 6-268257, and the like.

The specifications of the respective semiconductor layers are as follows.

Buffer layer 12: AlN (50 nm) n layer 13: Si-doped GaN (2200 nm)

Carrier density; $2 \times 10^{18}/cm^3$

Light-emitting layer 14: Quantum well layer; $In_{0.16}Ga_{0.84}N$ (3.5 nm)

Barrier layer; GaN (3.5 nm)

Repetition number of the quantum well layers and barrier layers; 5 p layer 15: Mg-doped GaN (75 nm)

Carrier density; $5 \times 10^{17}/cm^3$

The thus designed semiconductor layers are subjected to a reactive ion etching process and an after treatment (sputter etching) under the same conditions as the aforementioned sample was formed to thereby remove part of the p layer 15, the light-emitting layer 14, and the n layer 13 by etching.

Then, in accordance with the lift-off technique using photoresist, a base layer (150 Å) made of V and a main electrode layer (1.5 μm) made of Al are formed by vapor deposition on the surface of the n layer 13 that has been etched.

A transparent electrode 16 made of Au is thereafter vapor-deposited over almost all the surface of the p layer 15, and then an electrode 18 made of Au is formed on the transparent electrode 16.

Further, the thus prepared sample is heated in accordance with the history shown in FIG. 3 (at an alloying temperature of 550° C. for 3 minutes). As a result, the base layer and the main electrode layer are alloged and forms an n electrode 17.

The thus formed semiconductor wafer is cut into unit elements to be formed into desired light-emitting diodes. A light-emitting diode according to this embodiment is designed to have a peak wavelength at 520 nm.

The invention is not limited to the aforementioned modes of embodiment and embodiment whatsoever, but may read on various modes of modification that can be conceived by those skilled in the art within the scope of the invention as claimed.

The invention is, of course, applicable to laser diodes.

As described in the foregoing, the invention is characterized as forming a base layer of at least a metal selected from V, Nb, and Zr, or an alloy containing such metal on an n layer, as forming a main electrode layer made of other metal on the base layer, and as forming n electrodes by subjecting the n layer, the base layer, and the main electrode layer to a heat treatment.

When the n electrodes are formed in this way, stable ohmic contacts are obtained between the n electrodes and the n layer.

In the case where a portion for n electrode is formed by a reactive ion etching process in the n layer, no after treatment is required in the invention in order to obtain ohmic contacts between the n layer and the n electrodes although an after treatment (a sputter etching process using an inert gas such as argon gas) is required in the conventional method. As a result, the semiconductor manufacturing process steps can be curtailed.

A method of manufacturing a compound semiconductor device using GaN related materials, comprising: forming a semiconductor layer made of an n-type GaN compound semiconductor; forming a base layer on the portion, the base layer being made of a material reacting with a film forming on a surface of the semiconductor layer and being entrapped into a main electrode layer to be described later; and forming the main electrode layer on the base layer, the main electrode layer being made of a material being compatible with the semiconductor layer and having conductivity.

In the aforementioned method, the semiconductor layer may be made of silicon-doped GaN.

In the aforementioned method, the semiconductor layer may be made of $Al_XIn_YGa_{1-X-Y}N$ (including X=0, Y=0, X=Y=0).

In the aforementioned method, the semiconductor element may be a light-emitting diode.

Further, the following will also be disclosed.

A method of forming electrodes of a compound semiconductor device using GaN related materials, comprising the steps of: forming a semiconductor layer made of an n-type GaN compound semiconductor; forming a base layer on a portion for electrode of the semiconductor layer, the base layer being made of at least a metal selected from V, Nb, and Zr, or an alloy containing such metal; forming a main electrode layer on the base layer, the main electrode layer being made of at least a metal selected from Al, Ti, Zn, Ta, and Ni or an alloy including such metal; and subjecting the semiconductor layer, the base layer, and the main electrode layer to a heat treatment.

In the aforementioned method, the semiconductor layer may be made of silicon-doped GaN.

In the aforementioned method, the semiconductor layer may be made of $Al_XIn_YGa_{1-X-Y}N$ (including X=0, Y=0, X=Y=0).

In the aforementioned method, the semiconductor element may be a light-emitting element.

What is claimed is:

1. A method of manufacturing a semiconductor device using GaN related materials comprising:
    forming an n-type GaN semiconductor layer;
    forming a base layer of electrode on a portion of n-type GaN layer, the base layer being made of at least one metal selected from V, Nb, and Zr;
    forming a main electrode layer on the base layer, the main electrode layer being made of another metal; and
    heating the semiconductor layer, the base layer, and the main electrode layer.

2. The method of manufacturing a compound semiconductor device using GaN related materials according to claim 1, wherein the base layer is made of V and the main electrode layer is made of Al.

3. The method of manufacturing a compound semiconductor device using GaN related materials according to claim 1, wherein the base layer has a thickness of 75 to 1000 Å.

4. The method of manufacturing a compound semiconductor device using GaN related materials according to claim 1, wherein the heating step is carried out in a temperature range from 450 to 700° C.

5. The method of manufacturing a compound semiconductor device using GaN related materials according to claim 1, wherein the electrode forming comprises:
    forming a second layer made of either a p-type GaN semiconductor layer or an I-type semi-insulator layer on the semiconductor layer;
    dry-etching the second layer using a gas or the mixing gas containing the gas with at least either chlorine atom or fluorine atom; and
    substantially maintaining a surface of the etched area for electrode before the base layer of electrode forming step.

6. The method of manufacturing a compound semiconductor device using GaN related materials according to claim 5 further comprising dry-etching a part as the n-type semiconductor layer at the same time of dry-etching the second layer.

7. A GaN related compound semiconductor device comprising:
    a semiconductor layer made of an n-type GaN compound semiconductor; and
    an electrode arranged on the semiconductor layer and made from at least one metal selected from V, Nb, and Zr.

8. The GaN related compound semiconductor device according to claim 7, wherein an ohmic contact is provided between the electrode and the semiconductor layer.

9. The GaN related compound semiconductor device according to claim 7, wherein the electrode is made of an alloy of Al and V.

* * * * *